United States Patent [19]
Le Coz et al.

[11] Patent Number: 5,941,449
[45] Date of Patent: Aug. 24, 1999

[54] METHOD OF MAKING AN ELECTRONIC PACKAGE HAVING SPACER ELEMENTS

[75] Inventors: Christian Robert Le Coz, Endicott, N.Y.; Donald Ivan Mead; Roger James Stockholm, both of Montrose, Pa.

[73] Assignee: International Business Machines Corporation, Armonk, N.Y.

[21] Appl. No.: 09/020,693

[22] Filed: Feb. 9, 1998

Related U.S. Application Data

[62] Division of application No. 08/686,241, Jul. 23, 1996, Pat. No. 5,762,258.

[51] Int. Cl.⁶ .................................................. B23K 31/02
[52] U.S. Cl. ...................... 228/248.1; 228/212; 228/253; 228/254; 29/743; 29/840; 269/21; 269/903
[58] Field of Search ............................. 29/840, 843, 844, 29/743, DIG. 44; 269/21, 903; 228/180.22, 212, 254, 248.1, 253

[56] References Cited

U.S. PATENT DOCUMENTS

| | | |
|---|---|---|
| 4,830,264 | 5/1989 | Bitaillou et al. . |
| 4,871,110 | 10/1989 | Fukasawa et al. . |
| 5,118,027 | 6/1992 | Braun et al. . |
| 5,135,890 | 8/1992 | Temple et al. ........................... 437/215 |
| 5,159,171 | 10/1992 | Cook et al. . |
| 5,324,569 | 6/1994 | Nagesh et al. . |
| 5,332,463 | 7/1994 | Eberlein et al. ......................... 156/556 |
| 5,439,162 | 8/1995 | George et al. . |
| 5,765,744 | 6/1998 | Tatumi et al. ........................... 228/254 |
| 5,782,399 | 7/1998 | Lapastora .................................. 228/41 |
| 5,788,143 | 8/1998 | Boyd et al. .............................. 228/253 |

FOREIGN PATENT DOCUMENTS

| | | |
|---|---|---|
| 670664 | 9/1963 | Canada . |
| 3184353 | 8/1991 | Japan . |

OTHER PUBLICATIONS

Intl. Elec.Packaging Conf., Sep. 1993, vol. 2, pp. 740–748, .C–5 Solder Sphere Robotic Placement Cell For Overmolded Pad Array Carrier. by Martin.

*Primary Examiner*—Lee W. Young
*Assistant Examiner*—Bobby Rushing, Jr.
*Attorney, Agent, or Firm*—Lawrence R. Fraley

[57] ABSTRACT

A method of precisely positioning a quantity of conductive spacers (e.g., spherically shaped solder balls) on respective conductive pads (e.g., copper pads) of an underlying substrate (e.g., an FR4 printed circuit board or flexible circuit member) wherein the spacers are forcibly retained within a suitable holder and, when engaged with the respective pads, reflowed to effect a plurality of positive electrical connections between the spacers and pads. Such forcible retention allows for partial extension of the spacers from the invention's carrier, which is also disclosed.

16 Claims, 6 Drawing Sheets

METHOD OF MAKING AN ELECTRONIC PACKAGE HAVING SPACER ELEMENTS

This application is a divisional application of Ser. No. 08/686,241, filed Jul. 23, 1996. This application is now U.S. Pat. No. 5,762,258.

TECHNICAL FIELD

The invention relates to electronic packaging and particularly such packaging which may be used in information handling systems (computers). As will be understood from the following, the invention particularly relates to such packaging wherein very small conductive elements (spacers, preferably solder ball or the like elements) form an important part of the package structure to thereby assure highly dense electrical connections in a compact, relatively small product.

BACKGROUND

The use of electronic packaging having spacer elements (e.g., solder balls) is well known in the art with various examples shown and defined in U.S. Pat. No. 5,519,936 (Andros et al), U.S. Pat. No. 5,435,732 (Angulas et al), U.S. Pat. No. 5,170,931 (Desai et al) and U.S. Pat. No. 5,159,535 (Desai et al), all of which are assigned to the same assignee as the instant invention. These patents are thus incorporated herein by reference.

One particular type of electronic package, as shown in the above four patents, for example, is one which utilizes a thin, flexible circuitized substrate as part thereof. Such a substrate typically includes a thin dielectric layer (e.g., polyimide) having one or more circuit layers (e.g., copper) thereon. As shown in the first two patents above, two conductive layers (which may comprise the signal, power and/or ground layer for the package), if used, may be electrically coupled by what are known in the art as plated-through-holes (pths). Such holes in the dielectric layer include a conductive material (e.g., copper) thereon. Such holes are not necessary, of course, should only a single conductive layer be used. Understandably, the greater the number of conductive layers, the greater the functional capability of the resulting package.

It will be understood from the following that the invention is particularly adapted to electronic packaging of the aforementioned type which include either a thin, flexible circuitized substrate or one of greater thickness such as those comprised of ceramic or the well known fiberglass-reinforced epoxy material known as FR4. Such substrates are typically of considerably greater thicknesses than those of the flexible circuitry type. By way of example, an FR4 substrate (better known as a printed circuit or wiring board) may possess a thickness of about 0.030 inch while a corresponding thin flexible substrate having a thin polyimide dielectric layer and two external conductive layers (e.g., copper) may have a typical thickness of about 0.005 inch to about 0.010 inch. A ceramic substrate having one or more layers of circuitry on an upper surface thereof may possess a thickness of about 0.060 to about 0.080 inch.

The invention as defined herein provides a new and unique method for assembly of such packages and particularly for positioning and securing the very small spacers (preferably solder balls) on and to the package, respectively, so that it can then be electrically coupled to yet another packaging structure as part of an overall larger processing system. The spacers as defined herein are of extremely small size, typically being substantially spherical in shape and having a diameter as small as 0.030 inch and perhaps even smaller. Clearly, the precise positioning and coupling of several of such elements successfully to a circuitized substrate having several conductive sites thereon designed to be coupled to said elements is a major engineering challenge. It is further understood that by the term spacer is meant any electrically conductive element, including for example, solid metal (e.g., copper) balls, as well as solder balls of known solder alloys (e.g., 63:37 tin:lead, wherein the tin comprises approximately sixty-three percent of the total alloy volume) that, when coupled to an underlying substrate, will serve to space the substrate on which these are originally located at a spaced location from the initial substrate. Both substrates may thus be substantially parallel to one another if substantially equal quantity spacers are utilized.

There are various techniques for handling conductive spacer elements for use in electronic packages, particularly where the spacers are solder balls or the like. In U.S. Pat. No. 4,830,264 (Bitaillou et al), for example, solder preforms are located on flux atop individual through holes such that the resulting reflow operation causes the solder to enter the holes to thereby form solder terminals. In U.S. Pat. No. 4,871,110 (Fukasawa et al), an aligning plate is used in combination with suction to "attract solder balls into . . . through-holes". In U.S. Pat. No. 5,118,027 (Braun et al), solder paste is applied to solder balls in an alignment boat prior to positioning the combined paste-ball structures on a receiving substrate. In U.S. Pat. No. 5,159,171, a laser beam is used to reach solder reflow temperatures for solder elements on a circuit pattern. Unreflowed solder is then removed. In U.S. Pat. No. 5,324,569 (Nagesh et al), a stencil is used to position a plurality of solder balls onto a carrier or substrate, while in U.S. Pat. No. 5,439,162 (George et al), solder balls having flux deposited thereon are coupled to underlying conductive pads of a suitable substrate.

It is believed that a method for precisely aligning and positioning a plurality of extremely small conductive spacers onto associated conductor pads of a substrate which can be accomplished in a relatively easy manner while using structures of relatively simple yet effective construction would represent a significant advancement over the known art, including particularly the methods described in the foregoing six patents mentioned immediately above. It is further believed that a carrier for receiving and holding such spacers in a substantially fixed pattern relatively to one another to thus enable relatively facile connection to a receiving circuitized substrate would also constitute a significant art advancement.

DISCLOSURE OF THE INVENTION

It is, therefore, a primary object of the invention to enhance the electronic packaging art by providing an improved method for making such a package wherein expedited alignment and securement of relatively small sized conductive elements is possible.

It is another object of the invention to provide an improved carrier member for expedited handling of such conductive elements during such a method.

In accordance with one embodiment of the invention, there is provided a method of positioning a plurality of conductive spacer elements onto respective conductive pads or the like of a circuitized substrate. The method comprises the steps of providing a carrier having a plurality of holes therein of a predetermined first diameter, aligning a template having a plurality of openings therein each of a predetermined second diameter relative to the carrier such that the holes in the carrier are aligned with respective ones of the openings of the template, positioning a plurality of conductive spacer elements within respective ones of the openings within the template such that each of the conductive spacer elements is aligned with and located on a respective one of the holes in the carrier, engaging the conductive spacer elements located on respective ones of the holes within the carrier to force the elements at least partly into the holes in the carrier and to deform the elements at the parts of the conductive spacer elements not forcibly positioned within the holes, aligning the forcibly positioned and deformed conductive spacer elements within the holes in the carrier relative to respective conductive pads on a circuitized substrate, and heating the conductive spacer elements to cause the elements to become separated from the carrier and to be bonded to the conductive pads.

In accordance with another embodiment of the invention, there is provided a conductive spacer carrier member wherein the member includes a substantially rigid carrier member including a plurality of holes therein each of a predetermined first diameter, and a plurality of conductive spacer elements, selected ones of the conductive spacer elements being of a predetermined second diameter greater than the first diameters of respective ones of the holes within the carrier member, selected ones of the conductive spacer elements being compression fit within respective ones of the holes in the carrier member such that the selected ones of the conductive spacer elements partially extend into the respective holes within the carrier member.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
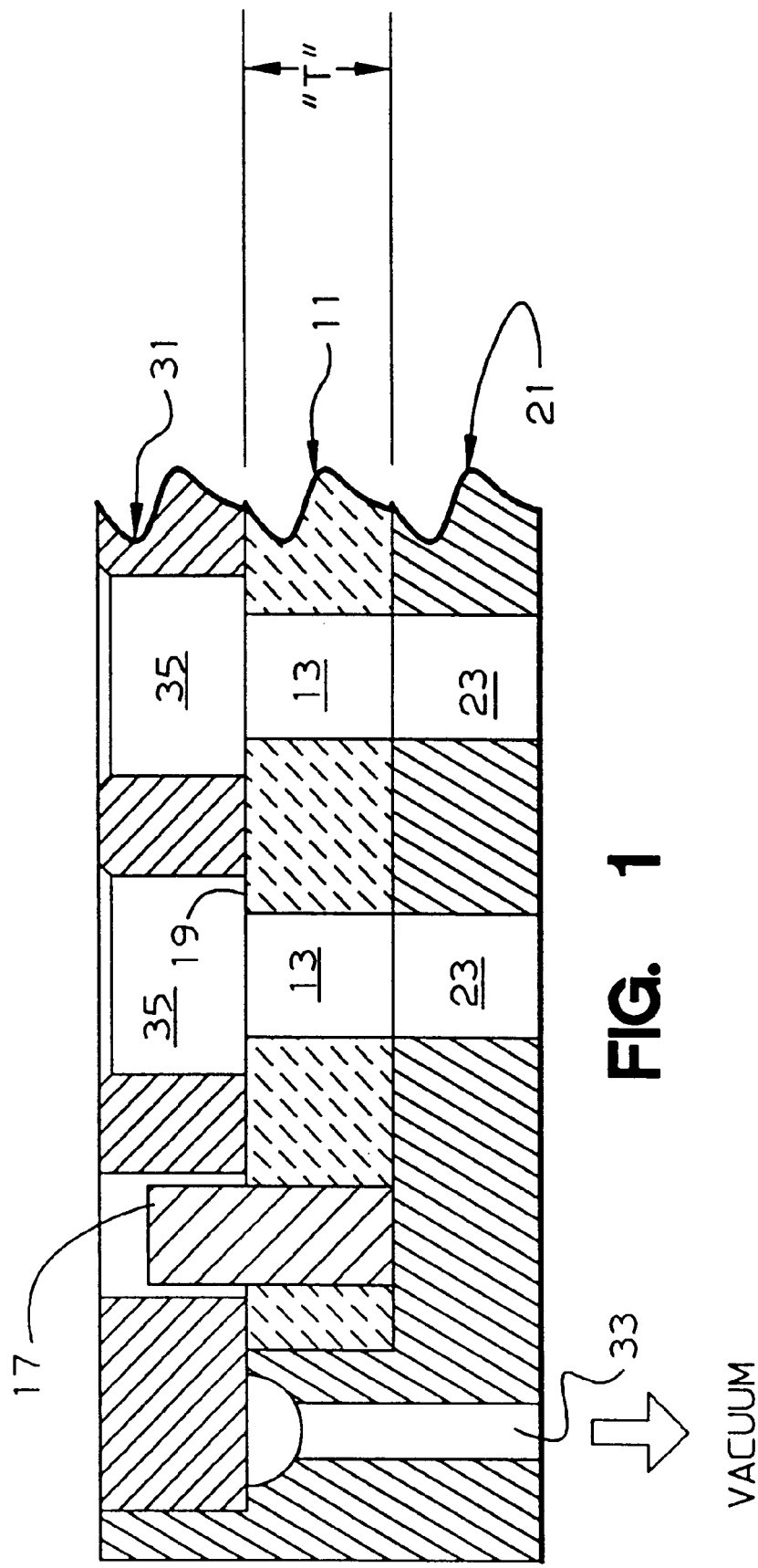
FIGS. 1–6 represent the steps of the method of the invention which result in a circuitized substrate such as shown in FIG. 6, the invention's carrier member also being shown in these figures.

In FIG. 1, there is shown the first step for positioning a plurality of conductive spacer elements onto respective conductive pads (FIG. 5) of a circuitized substrate. In FIG. 1, a carrier 11 is provided and includes a plurality of substantially cylindrically shaped holes 13 therein. Carrier 11 is preferably in the form of a substantially rectangular shaped, relatively flat plate and, in one embodiment of the invention, included a total of 196 holes 13, on 0.100 inch centers, therein, these holes arranged in a predetermined pattern which, understandably, will correspond to that of the circuitized substrate's conductive pads on which the several electrical connections are to be formed. Alternatively, as many as 225 holes on 0.050 inch centers, have been successfully used. Preferably, carrier 11 is comprised of a material which is substantially non-wettable by solder. Such a feature is desired if the selected conductive spacer elements for being mounted onto respective pads are solder elements. Solder is the preferred conductive material for spacer elements of the type described herein and the invention will herein be described with respect to such material. However, it is understood that the invention's teachings are not limited to the use of solder, as other material, e.g., solid copper, may be used for the elements providing the connections described herein. Further, holes 13 need not extend entirely through the carrier body. Such holes may also be of tapered or other configuration than that shown.

A possible metallic material for carrier 11 is ceramic and, in one example, the carrier possessed a thickness (dimension "T" in FIG. 1) of about 0.060 inch and, being rectangular (preferably square), possessed side dimensions each of about 1.44 inch. The described pattern of holes 13 is such that these holes are spaced apart on about 0.100 inch centers, each hole 13 having a diameter within the range of slightly less than about 0.029 inch to about 0.030 inch. A metallic material (e.g., titanium) that is also substantially non-wettable by solder and, significantly, which may be heated to relatively high temperatures without unacceptable thermal expansion, has also proven to work successfully.

The preferred spacer elements 15 (FIG. 2) are, as described, of solder material and, in a preferred embodiment of the invention, were of 63:37 tin:lead solder wherein the tin constitutes approximately 63 percent by weight of the composition with the remainder being substantially lead material. In another embodiment, 90:10 tin:lead solder alloy may be utilized.

As also seen in FIG. 1, carrier 11 includes at least one upstanding projection member 17 positioned therein which is adapted for extending a predetermined distance (e.g., about 0.015 inch) above the carrier's upper surface 19. In a preferred embodiment, a total of three such projection members 17 were utilized, these being strategically positioned about the rectangular carrier 11 in accordance with a predetermined triangular pattern.

In a preferred embodiment, carrier 11 is positioned within a holder 21, preferably of metallic material (e.g., stainless steel). Holder 21, like carrier 11, is also preferably of substantially rectangular shape and includes therein a rectangular opening designed to precisely accommodate the rectangular carrier member. As seen in FIG. 1, holder 21 includes a plurality of holes 23 therein, these holes in one embodiment of the invention being substantially cylindrical and of a diameter approximately the same as that of the adjacent holes 13. Accordingly, a similar number of holes 23 is provided. In FIG. 1, there is also shown a template 31, also preferably of metallic material (e.g., stainless steel) which, as shown, is adapted for being positioned atop carrier 11. Significantly, template 31 is also retained within a larger opening within holder 21 such that, when positioned, the template is located substantially on and precisely aligned with the underlying carrier. Significantly, the upstanding projections 17 of carrier 11 may be used to facilitate such alignment of the invention's template. Template retention is preferably accomplished using a vacuum, drawn through an elongated side opening 33. A suitable pump or the like (not shown) may be utilized to provide the suction force so as to create the desired vacuum needed to assure effective template retention. In one embodiment, a total of 196 openings 33 are provided. Significantly, template 31 includes a similar number of openings 35 therein as the number of holes 13 in the underlying carrier 11. In a preferred embodiment, each of the openings 35 is also of substantially cylindrical configuration, each possessing a diameter of slightly greater than about 0.035 inch. It is thus seen that these openings 35 are slightly larger than the respective underlying holes 13. Template 31, as shown, possesses a thickness (e.g., about 0.023 inch) less than that of carrier 11.

Figure 2:
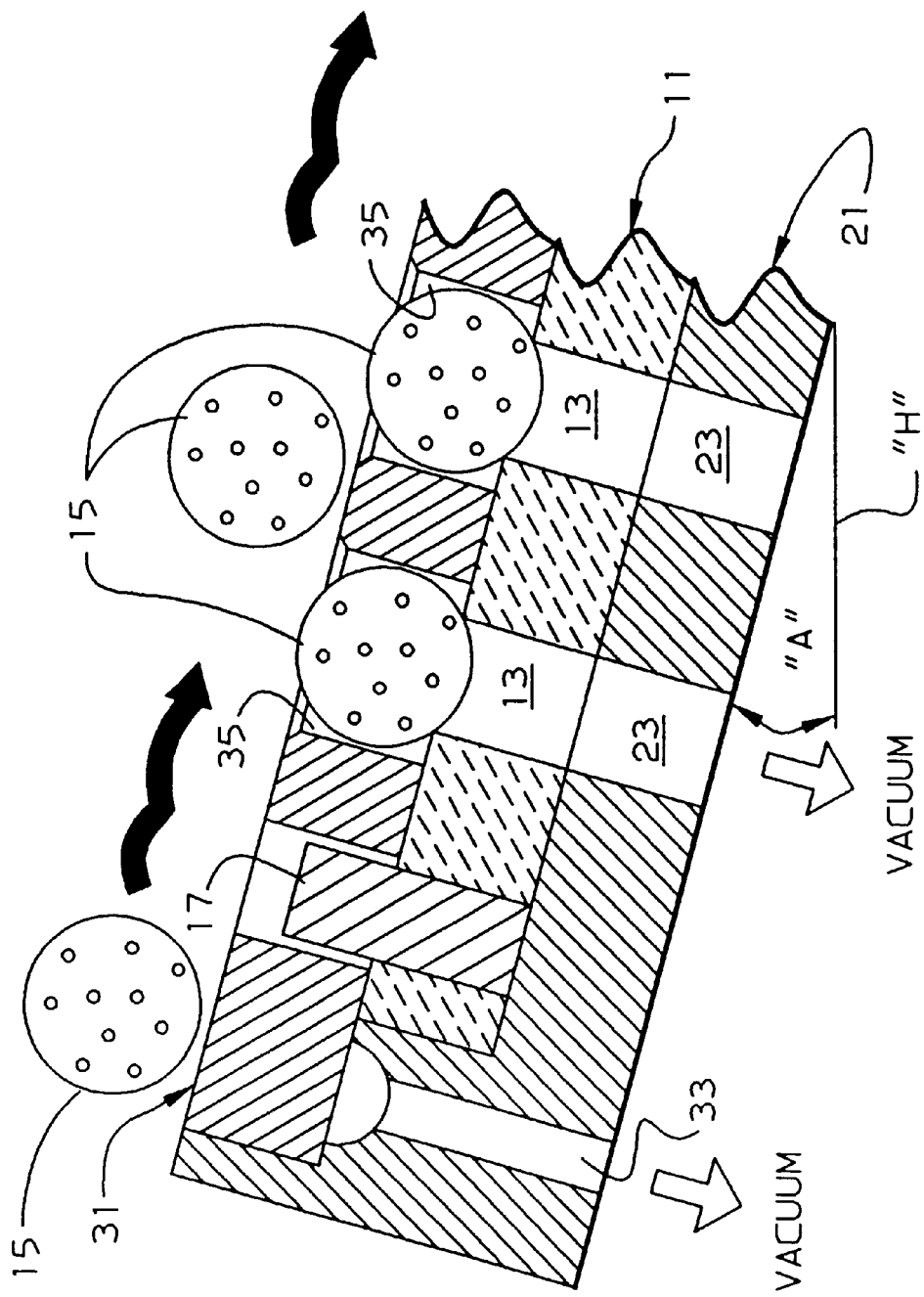

In FIG. 2, the combined subassembly of FIG. 1 is shown as being tilted at an angle of about 10 to about 15 degrees relative to the horizon ("H"). In one example, the subassembly was tilted at an angle ("A") of about 12.5 degrees. With this subassembly so angularly positioned, a plurality of conductive spacer elements 15 (in this case, spherical solder balls) are deposited along the uppermost edge portions of the structure so as to roll downward across the openings 35 within template 31. In a preferred embodiment, these solder ball elements 15 possessed a diameter of slightly greater than about 0.030 inch and were thus of smaller size than the corresponding larger openings 35, but larger than openings 13. As a result, each solder ball 15 becomes easily deposited within a respective opening 35, as shown in FIG. 2. Significantly, the size of each solder ball is relatively large enough that additional solder balls will not be prevented from further downward movement. This size, coupled with the appropriate angular displacement from further downward movement. This size, coupled with the appropriate angular displacement of the structure in FIG. 2, assures that only a singular ball will be effectively positioned within a corresponding opening 35, while all other solder balls will be effectively passed over the structure's upper surface for appropriate collection. In one example, a total of 300–400 solder balls was dispensed onto the structure as shown in FIG. 2 such that the desired total (196) of balls were effectively positioned within the correspondingly similar number of openings 35. The excess solder balls which do not become positioned within the template's openings 35 may then be used to fill yet another, similar structure. During the positioning of solder ball elements 15, the vacuum is maintained on template 31.

Figure 3:
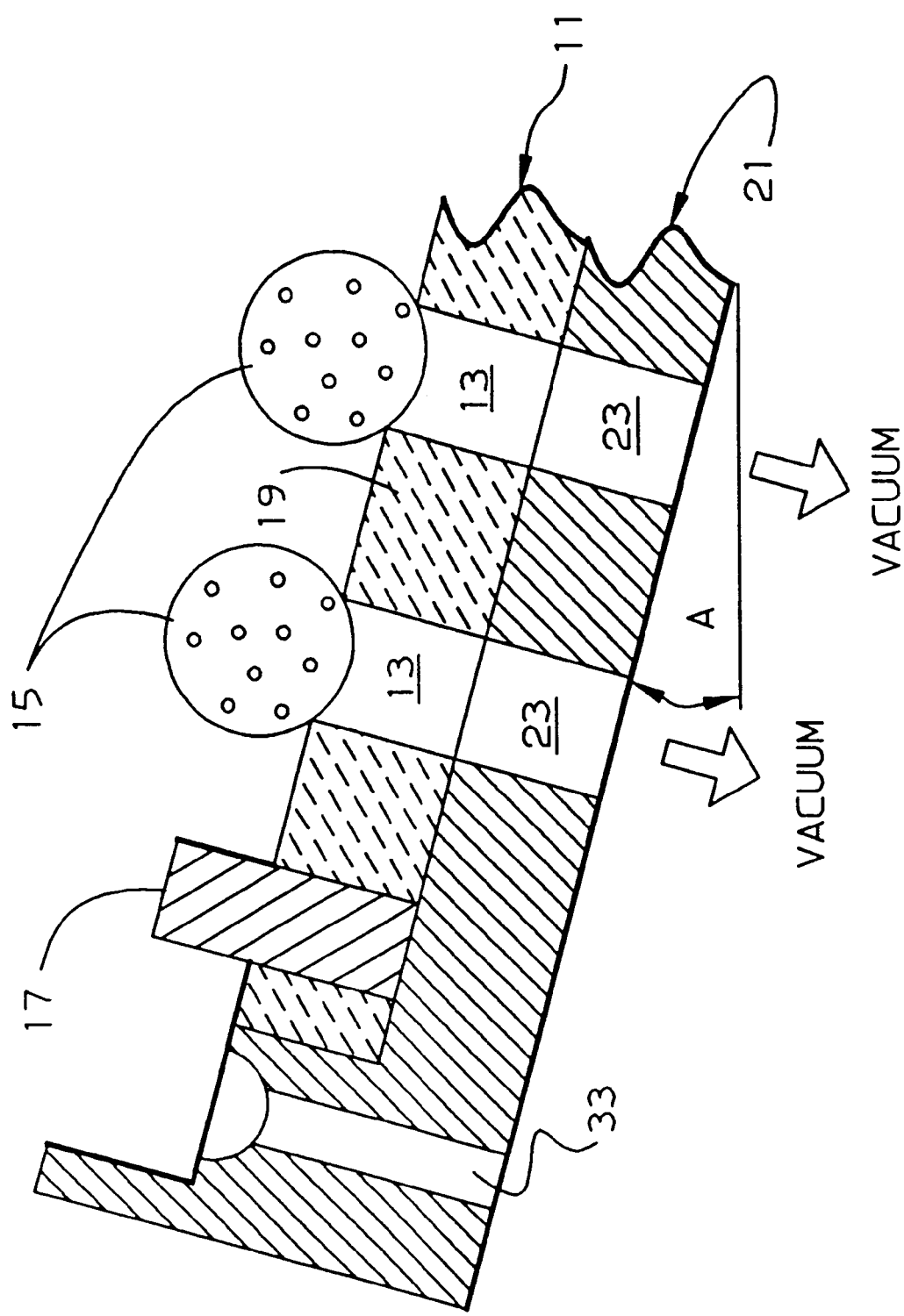

In FIG. 3, the vacuum draw is terminated on template 31 and the template is removed. The resulting carrier and holder subassembly, still located at the angular position described above, effectively retains the solder balls 15 partially within the smaller diameter carrier holes 13. During solder ball positioning, vacuum is provided to the aligned, paired holes 13 and 23 by suitable means, including the same pump or the like used to provide vacuum through apertures 33. Accordingly, this vacuum assures positive retention of the larger solder ball elements 15 within the smaller holes 13 to thus prevent removal of these solder ball elements as may occur (e.g., caused by vibrations) during normal, additional manufacturing operations. Again, vacuum is not necessarily drawn through apertures 33 but is preferably terminated to facilitate template removal.

Figure 4:
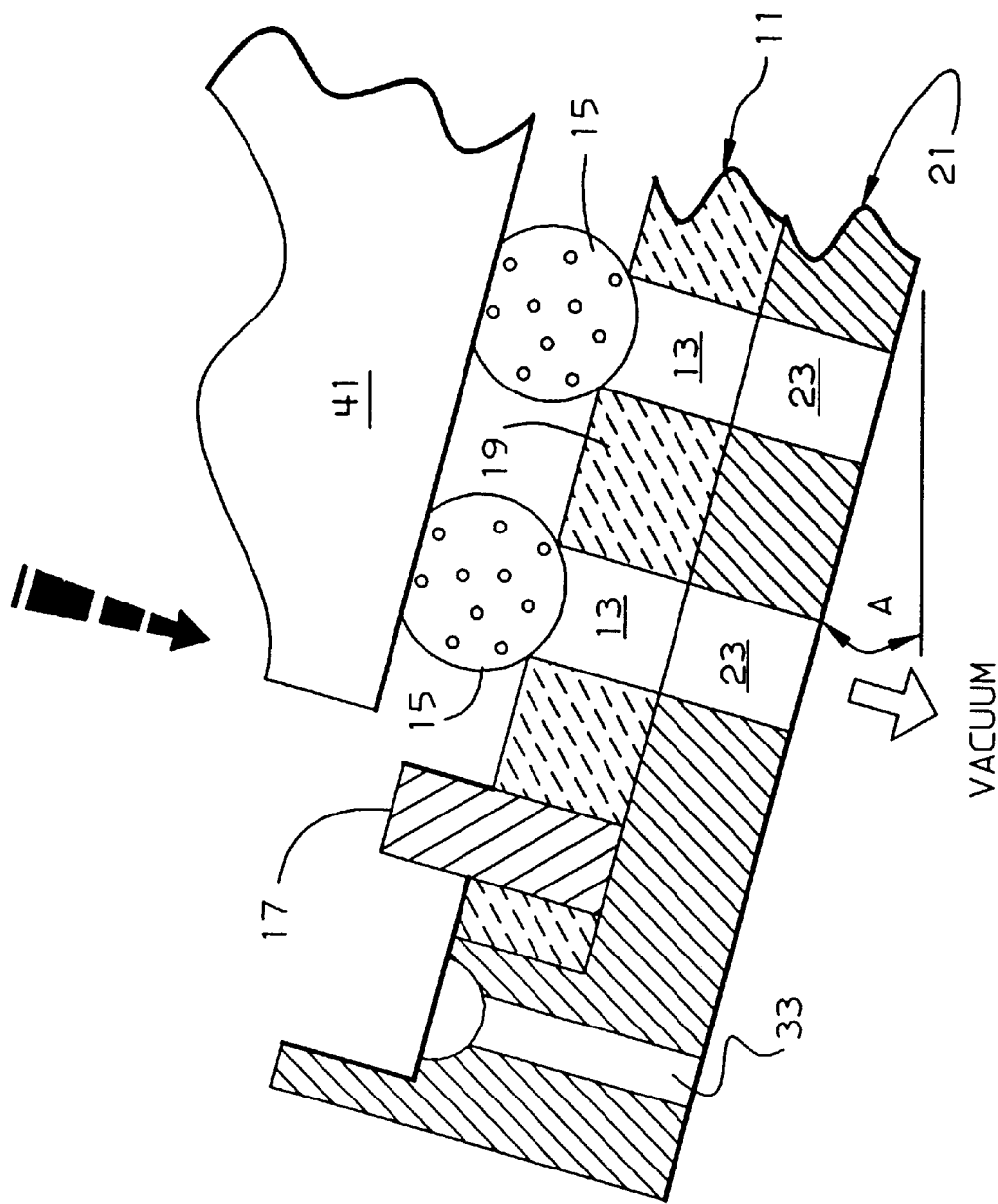
Figure 5:
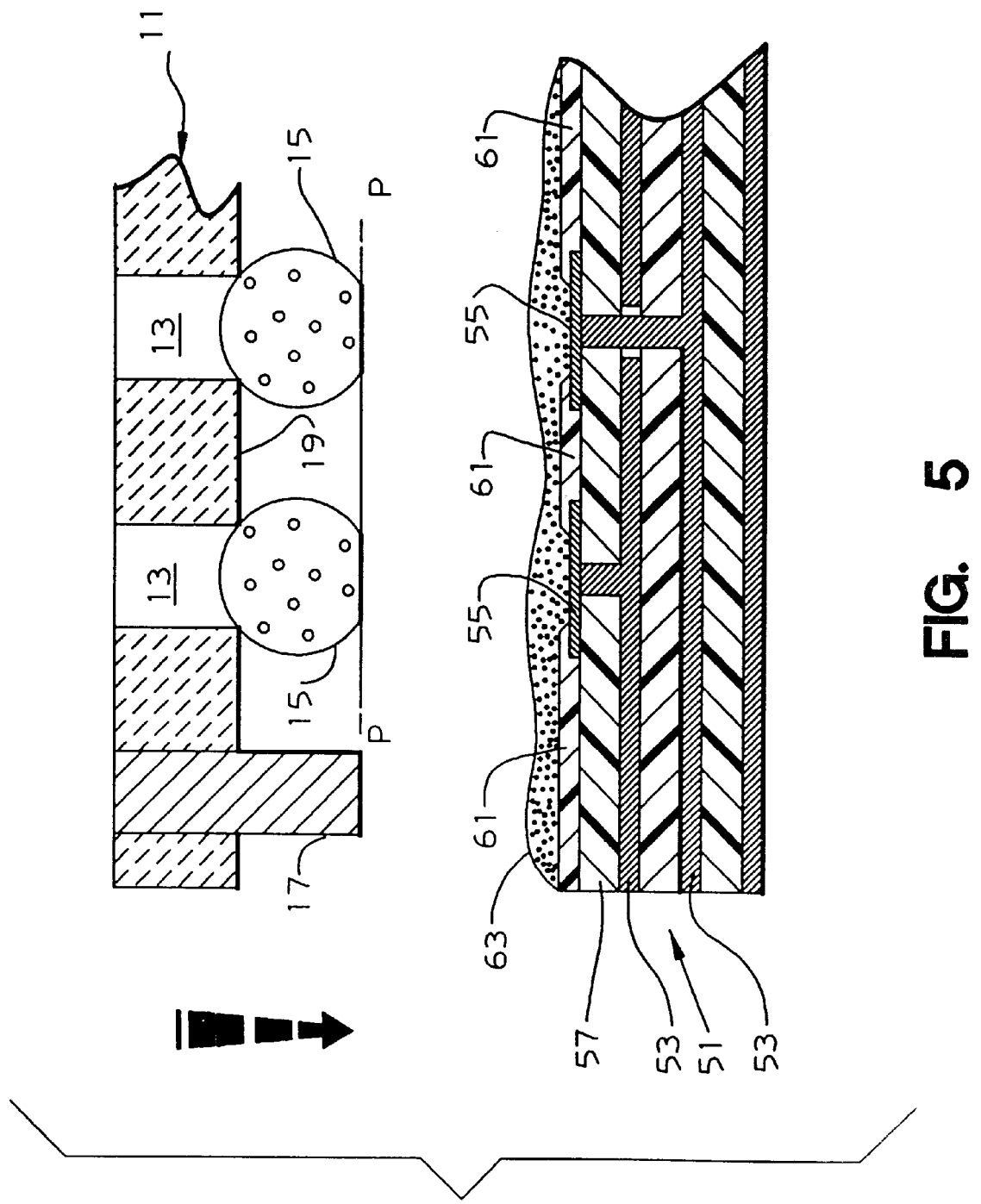

In FIG. 4, the angularly positioned subassembly, still having vacuum drawn through aligned openings 13 and 23, is engaged by an anvil 41. As particularly seen in FIG. 4, the anvil 41 only engages the uppermost surfaces of each of the solder elements 15 to deform this portion of each solder element and to force these elements further into the respective holes 13 of carrier 11. In one embodiment, these solder elements 15 were forced approximately an additional 0.010–0.015 inch into the holes. As a result, the edge portions of carrier 11 about each of the holes 13 partially penetrate the slightly indented solder elements 15. In a preferred embodiment, anvil 41 is of metallic (e.g., stainless steel) material. Most significantly, when the anvil is withdrawn, the upper, common surfaces of the solder elements 15 substantially occupy a singular common plane (P-P in FIG. 5) that is substantially parallel to the upper surface 19 of carrier 11. Of further significance, this common plane P-P is at a substantially similar distance from surface 19 as the outermost surface of the upstanding projection 17 located adjacent thereto. Such a positioning relationship allows the upstanding projections 17 to function as standoffs during the subsequent manufacturing step wherein the carrier 11, having the solder elements secured therein, is inverted and aligned over an underlying substrate 51 (as seen in FIG. 5). Substrate 51 may be, in one embodiment, a printed circuit (or wiring) board of the multilayer variety wherein a plurality of conductive planes 53 are utilized, in addition to a pattern of conductive pads 55 along the substrate's upper surface 57. In addition, a suitable, protective dielectric material 61 is utilized to protect the remaining, exposed portions of upper surface 57. Still further, solder flux is also preferably utilized and applied across substantially the entire upper surface of the substrate. This flux removes any possible oxides that might have formed on the metallic spacers 15 at an appropriate elevated temperature (e.g., 150° C.), and may be brush applied. Alternatively, solder paste can be used (e.g., screened on) should it be desired to use two different melting point materials for the conductive spacers and paste elements, respectively. For example, 10:90 tin:lead solder can be used for spacers 15 and a lower melting point solder (e.g., 63:37 tin:lead) used for individual solder paste elements formed on respective ones of the lower pads 55.

Multilayer circuit boards of the type described above are well-known in the art and further description is not believed necessary. It is also known in the art to interconnect respective conductive planes 53 within the structure to respective conductive pads 55 on the structure's upper surface. Such connection may be accomplished using plated-through-holes or the like. Such connections may also be attained by providing clearance openings within one of the conductive planes such that the conductor projects therethrough and is electrically isolated therefrom. Such a construction is shown for the conductive pad 55 shown to the right in FIG. 5. Significantly, it is not necessary to use a vacuum draw on the retained solder elements 15 when the carrier 11 is shown in the inverted position of FIG. 5 such that the solder elements project therebelow. This is due to the substantial penetration of each element within the respective holes 13 and the resulting deformation to the solder ball internal surfaces by the non-wettable carrier 11.

In the next step of the invention, the carrier and solder ball subassembly is lowered until the solder elements substantially respectively engage the corresponding conductor pads 55. When so positioned, the resulting subassembly is placed within an oven and solder reflow occurs. In one embodiment, the subassembly was heated to a temperature of about 200–220 degrees Celsius (C) for a time period of about one minute. The invention is not limited to this particular type of reflow operation or to the temperatures stated, however, in that the reflow temperature is dependent on the respective solder alloy material utilized. With a 63:37 tin:lead solder, the above temperature, maintained for a time period of about one minute, has proven effective in accomplishing solder reflow and effective connection to the underlying conductive pads 55 after cooling. Additionally, other heating means may be utilized to accomplish reflow, examples being vapor phase reflow, direct infrared, conductive and convective (e.g., use of hot nitrogen gas). Once reflow has occurred and the effective connections accomplished between solder ball elements 15 and pads 55, carrier 11 is withdrawn. The resulting solder-pad bonds are sufficiently stronger than the mechanical bond between carrier and solder balls, to therefore facilitate carrier withdrawal. Such withdrawal occurs subsequent to the pad-bond connections (e.g., solder cool-down).

Although it has been stated that solder flux 63 may be utilized in the invention, it is possible to provide solder ball element connection to the pads 55 without the need for such material.

Figure 6:
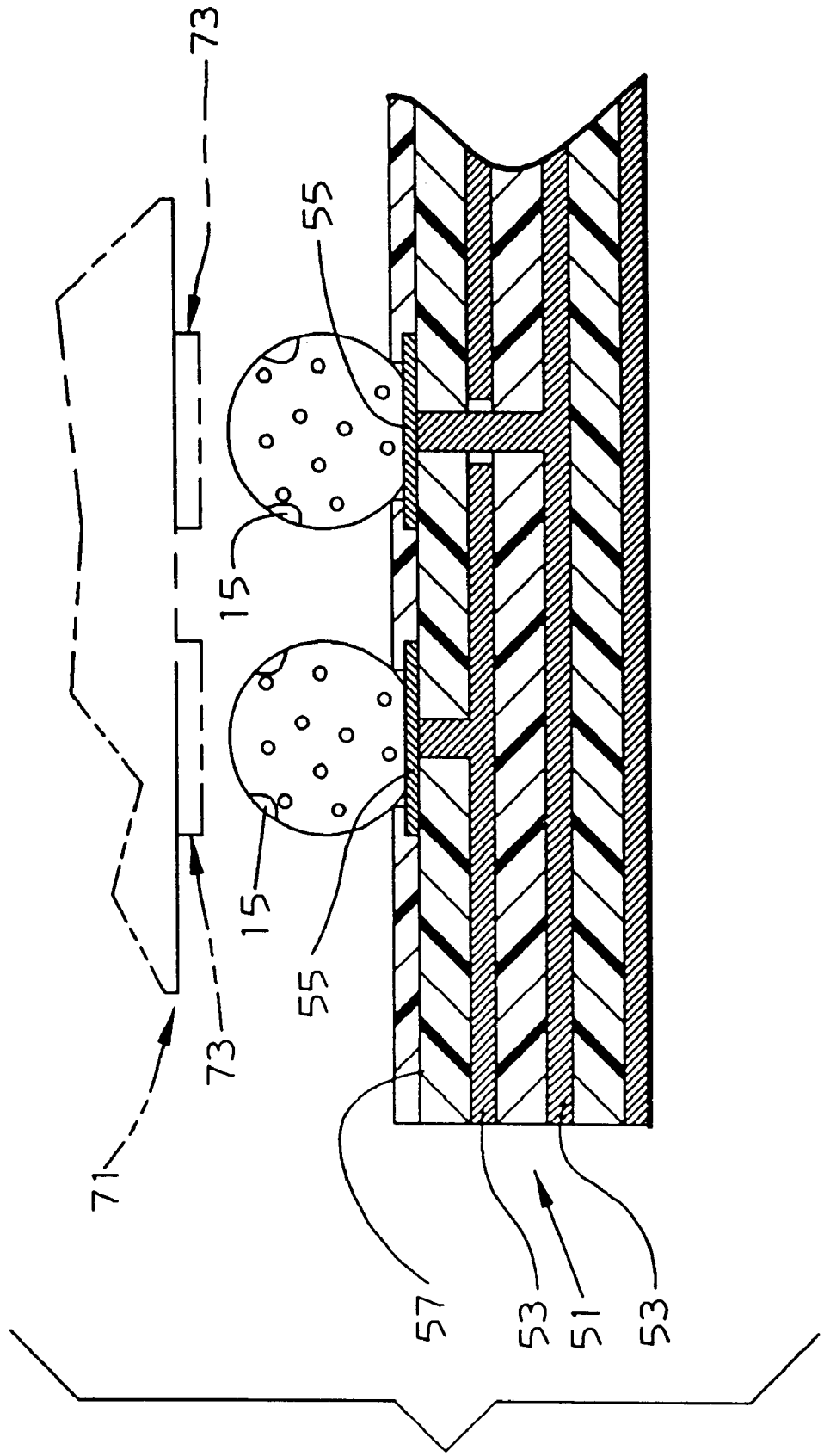

The resulting circuitized substrate as seen in FIG. 6 is now adaptable for being electrically coupled through the solder ball elements 15 to another circuitized substrate structure as shown in FIG. 6 or the like to thereby form a package assembly, e.g., for use in an information handling system. In one example, this substrate and solder ball subassembly may be aligned over another, larger printed circuit board 71 and lowered until contact is made between solder elements 15 and respective conductors 73 on this larger board. A second heating (reflow) operation may then occur to effect connection between the two substrates. Such heating may be accomplished in a similar manner to that described above for the coupling between elements 15 and conductive pads 55.

Thus there has been shown and described a new and unique method for precisely positioning relatively small solder elements onto a circuitized substrate such that the resulting structure can then be effectively coupled to yet another electronic structure (e.g., another circuit board) to form a larger packaging assembly (e.g., for use in a computer). The unique method as described herein provides for positive solder ball retention in a forcible manner without substantial deformation to the individual elements. Additionally, the defined method may be accomplished using known equipment in the art or equipment with relatively minor modification thereto.

While there have been shown and described what are at present considered the preferred embodiments of the invention, it will be obvious to those skilled in the art that various changes and modifications may be made therein without departing from the scope of the invention as defined by the appended claims. For example, it is possible to utilize substantially chamfer-shaped edges for carrier 11 rather than the sharp edges shown in the drawings to thereby substantially prevent any undesirable surface deformation on the upper portions of the spacers (those opposite the part of the spacer being bonded to a pad 55). Such an edge shape may also facilitate spacer positioning and carrier removal after bond formation.

We claim:

1. A method of positioning a plurality of conductive spacer elements onto respective conductive pads of a circuitized substrate, said method comprising:

providing a carrier having a plurality of holes therein of a predetermined first diameter;

aligning a template having a plurality of openings therein each of a predetermined second diameter relative to said carrier such that said holes in said carrier are aligned with said openings of said template;

positioning a plurality of conductive spacer elements within said openings within said template such that each of said conductive spacer elements is aligned with and located on a respective one of said holes in said carrier;

engaging said conductive spacer elements located on said holes within said carrier to force at least part of each of said elements into said holes in said carrier while a remaining part of each of said spacer elements is located externally of said holes and to deform said remaining part of each of said elements not forcibly positioned within said holes;

aligning said conductive spacer elements within said holes in said carrier relative to conductive pads on a circuitized substrate; and heating said conductive spacer elements to cause said elements to become bonded to said conductive pads.

2. The method of claim 1 wherein said aligning of said template includes applying a vacuum onto said template to retain said template relative to said carrier.

3. The method of claim 1 further including providing a holder member and thereafter positioning said carrier within said holder member.

4. The method of claim 3 wherein said aligning of said template relative to said carrier further includes aligning said template relative to said holder member.

5. The method of claim 4 wherein said carrier includes at least two upstanding projections thereon and said template includes at least two apertures therein, said apertures within said template aligning with said upstanding projections of said carrier during said aligning of said template relative to said carrier such that said projections project within said template apertures.

6. The method of claim 5 wherein said aligning of said template relative to said carrier further includes applying a vacuum through said holder member onto said template.

7. The method of claim 1 wherein said positioning of said conductive spacer elements within said openings within said template comprises positioning said template at a first angular orientation and thereafter allowing said conductive spacer elements to move downwardly across said template such that individual ones of said conductive spacer elements drop into respective ones of said template openings.

8. The method of claim 7 further including applying vacuum through said openings within said template during said downward movement of said conductive spacer elements to facilitate said dropping of said conductive spacer elements within said template openings.

9. The method of claim 1 wherein said engaging of said conductive spacer elements within said holes within said carrier is accomplished using an anvil member having a substantially planar engagement surface for engaging said conductive spacer elements to force said elements within said holes within said carrier.

10. The method of claim 9 further including applying vacuum through said holes within said carrier to hold said conductive spacer elements in position relative to said holes within said carrier and thereafter separating said template from said carrier member.

11. The method of claim 10 wherein said separating of said template from said carrier member is accomplished prior to said engaging said conductive spacer elements within said holes within said carrier.

12. The method of claim 1 wherein said aligning of said forcibly positioned and deformed conductive spacer elements relative to said conductive pads on said circuitized substrate is accomplished with said carrier member and said deformed conductive spacer elements are located over said circuitized substrate.

13. The method of claim 12 wherein said conductive spacer elements are positioned in contact with said conductive pads immediately prior to said heating of said conductive spacer elements.

14. The method of claim 1 further including applying solder paste onto said conductive pads prior to said heating of said conductive spacer elements.

15. The method of claim 1 wherein said second diameters of said openings in said template are substantially larger than said diameters of said holes in said carrier.

16. The method of claim 15 wherein said conductive spacer elements are substantially spherical in configuration and said openings in said template are substantially cylindrical in configuration, said second diameters of said template openings being substantially larger than the diameters of said conductive spacer elements.

* * * * *